(12) United States Patent
Shen

(10) Patent No.: US 7,411,285 B2
(45) Date of Patent: Aug. 12, 2008

(54) LOW PROFILE STACKED SEMICONDUCTOR CHIP PACKAGE

(76) Inventor: Yu-Nung Shen, No. 60, Lane 328, Li-Shan Street, Nei-Hu Dist., Taipei City (TW)

( * ) Notice: Subject to any disclaimer, the term of this patent is extended or adjusted under 35 U.S.C. 154(b) by 250 days.

(21) Appl. No.: 11/302,245

(22) Filed: Dec. 14, 2005

(65) Prior Publication Data

US 2007/0001294 A1    Jan. 4, 2007

(30) Foreign Application Priority Data

Jul. 1, 2005    (TW) .............................. 94122520 A

(51) Int. Cl.
*H01L 23/48* (2006.01)
*H01L 23/02* (2006.01)

(52) U.S. Cl. .................. 257/686; 257/777; 257/778; 257/774; 257/E23.011

(58) Field of Classification Search ........... 257/777, 257/686, 774, 778, E23.011, E21.614
See application file for complete search history.

(56) References Cited

U.S. PATENT DOCUMENTS 6,577,013 B1 *    6/2003  Glenn et al. ................. 257/777
6,774,473 B1 *    8/2004  Shen .......................... 257/686
6,856,026 B2 *    2/2005  Yamada et al. ............... 257/774
7,276,799 B2 *   10/2007  Lee et al. .................... 257/777
2004/0119162 A1*  6/2004  Egawa ......................... 257/734
2004/0207049 A1* 10/2004  Bauer et al. ................. 257/620
2005/0014311 A1*  1/2005  Hayasaka et al. ............ 438/109

* cited by examiner

*Primary Examiner*—Nitin Parekh
(74) *Attorney, Agent, or Firm*—Houston Eliseeva LLP

(57) ABSTRACT

A stacked semiconductor chip package comprising a first semiconductor chip having an upper surface, a lower surface opposed to said upper surface, and a plurality of conductive metal lines formed on said upper surface of said first semiconductor chip; a plurality of metal elements each having a first arm portion located on said upper surface of said first semiconductor chip and connected electrically to a corresponding one of said metal lines, a second arm portion located on said lower surface of said first semiconductor chip; and a second semiconductor chip having a lower surface and a plurality of conductive bumps provided on said lower surface, and mounted on said upper surface of said first semiconductor chip in such a manner that said solder bumps of said second semiconductor chip is electrically connected to said corresponding conductive metal lines on said upper surface of said first semiconductor chip.

8 Claims, 15 Drawing Sheets

LOW PROFILE STACKED SEMICONDUCTOR CHIP PACKAGE

BACKGROUND OF THE INVENTION

1. Field of the Invention

The present invention relates to a stacked semiconductor chip package, and more particularly, to a low profile stacked semiconductor chip package.

2. Description of Related Art

Recent trends in electronics have been developed toward miniaturization, i.e., smaller and thinner chips. To satisfy these demands, chip scale packaging technology and chip stacking technology have been introduced. For a stacked semiconductor chip package, the memory capacity of the stacked semiconductor chip package is doubled if two chips with the same size and capacity are stacked. However, the height of the stacked semiconductor chip package will also be increased, thereby conflicting with the trend of miniaturization.

SUMMARY OF THE INVENTION

The object of the present invention is to provide a low profile stacked semiconductor chip package.

According to one aspect of the present invention, a stacked semiconductor chip package comprises: a mounting substrate having an upper surface, a lower surface opposed to said upper surface, a rectangular accommodating opening formed at a central portion of said mounting substrate, a plurality of plated through-holes each communicating said upper and lower surfaces, a plurality of first conductive metal lines formed on said upper surface of said mounting substrate, and a plurality of second conductive metal lines formed on said lower surface of said mounting substrate, each of said first conductive metal lines extending from a corresponding one of said plated through-holes to one of opening-confining walls that cooperatively confine said opening, each of said second conductive metal lines extending from a corresponding one of said plated through-hole to one of said opening-confining walls; a first semiconductor chip having an upper surface, a lower surface opposed to said upper surface, a plurality of conductive bumps provided on said lower surface of said first semiconductor chip, a plurality of third conductive metal lines formed on said upper surface of said first semiconductor chip, a plurality of fourth conductive metal lines formed on said lower surface of said first semiconductor chip, each of said third conductive metal lines extending from a corresponding edge of said first semiconductor chip to a predetermined position, each of said fourth conductive metal lines extending from a corresponding edge of said first semiconductor chip to a corresponding one of said conductive bumps so as to connect electrically with said corresponding one of said conductive bumps, said first semiconductor chip received in said accommodating opening of said mounting substrate so that each of said third conductive metal lines is linked electrically with a corresponding one of said first conductive metal lines, and that each of said fourth conductive metal lines is linked electrically with a corresponding one of said second conductive metal lines; and a second semiconductor chip having a lower surface and a plurality of conductive bumps provided on said lower surface, and mounted on said upper surface of the first semiconductor chip in such a manner that said solder bumps of said second semiconductor chip are electrically connected to said corresponding third conductive metal lines.

According to another aspect of the present invention, a stacked semiconductor chip package comprises: a first semiconductor chip having an upper surface, a lower surface opposed to said upper surface, and a plurality of conductive metal lines formed on said upper surface of said first semiconductor chip, each of said conductive metal lines on said upper surface of said first semiconductor chip extending from a corresponding edge of said first semiconductor chip to a predetermined position; a plurality of metal elements each having a first arm portion located on said upper surface of said first semiconductor chip and connected electrically to a corresponding one of said metal lines, a second arm portion located on said lower surface of said first semiconductor chip, and a connecting portion interconnecting said first and second arm portions; and a second semiconductor chip having a lower surface and a plurality of conductive bumps provided on said lower surface, and mounted on said upper surface of said first semiconductor chip in such a manner that said solder bumps of said second semiconductor chip is electrically connected to said corresponding conductive metal lines on said upper surface of said first semiconductor chip.

According to a further aspect of the present invention, a stacked semiconductor chip package comprises: a first semiconductor chip having an upper surface, a lower surface opposed to said upper surface, a plurality of conductive bumps provided on said lower surface, a plurality of semi-circular plated holes located along edges of said first semiconductor chip, a plurality of conductive metal lines formed on said upper surface, and a plurality of conductive metal lines formed on said lower surface, each of said conductive metal lines on said upper surface extending from a corresponding one of said plated holes to a predetermined position, each of said conductive metal lines on said lower surface extending from a corresponding one of said conductive bumps to a corresponding one of said plated holes; and a second semiconductor chip having a lower surface and a plurality of conductive bumps provided on said lower surface, and mounted on said upper surface of said first semiconductor chip in such a manner that said solder bumps of said second semiconductor chip are electrically connected to said corresponding third conductive metal lines on said upper surface of said first semiconductor chip.

According to still another aspect of the present invention, a stacked semiconductor chip package comprises: a carrying substrate having an upper surface, a lower surface opposed to said upper surface, a plurality of plated through-holes communicating said upper and lower surfaces, a plurality of conductive bumps provided on said lower surface, a plurality of first conductive metal lines formed on said upper surface, and a plurality of second conductive metal lines formed on said lower surface, each of said first conductive metal lines extending from a corresponding one of said plated through-holes to a predetermined position, each of said second conductive metal lines extending from a corresponding one of said plated through-holes to a corresponding one of said conductive bumps; a first semiconductor chip having an upper surface, a lower surface opposed to said upper surface, a plurality of contacts formed on said lower surface of said first semiconductor chip and connected electrically to internal circuitry of said first semiconductor chip, and a plurality of conductive metal lines formed on said lower surface of said first semiconductor chip, each of said conductive metal lines extending from a corresponding edge of said first semiconductor chip to a corresponding one of said contacts; a plurality of first metal elements each having a first arm portion located on said upper surface of said first semiconductor chip and connected electrically to a corresponding one of said conductive metal lines on said upper surface of said first semiconductor chip, a second arm portion located on said lower surface of said first semiconductor chip, and a connecting portion interconnecting said first and second arm portions, said first semiconductor chip mounted on said upper surface of said carrying substrate in such a manner that said second arm portion of each of said first metal elements is connected electrically to a corresponding one of said first conductive metal lines; a second semiconductor chip having an upper surface, a lower surface opposed to said upper surface, a plurality of contacts formed on said lower surface of said second semiconductor chip and connected electrically to internal circuitry of said second semiconductor chip, and a plurality of conductive metal lines formed on said lower surface of said second semiconductor chip, each of said conductive metal lines extending from a corresponding edge of said second semiconductor chip to a corresponding one of said contacts; and a plurality of second metal elements each having a first arm portion located on said upper surface of said second semiconductor chip, a second arm portion located on said lower surface of said second semiconductor chip and connected electrically to a corresponding one of said conductive metal lines on said lower surface of said second semiconductor chip, and a connecting portion interconnecting said first and second arm portions, said second semiconductor chip mounted on said first semiconductor chip in such a manner that said second arm portion of each of said second metal elements is connected electrically to said first arm portion of a corresponding one of said first metal elements.

According to another aspect of the present invention, a stacked semiconductor chip package comprises: a first semiconductor chip having an upper surface, a lower surface opposed to said upper surface, a plurality of conductive bumps formed on said lower surface of said first semiconductor chip, and a plurality of conductive metal lines formed on said lower surface of said first semiconductor chip, each of said conductive metal lines extending from a corresponding edge of said first semiconductor chip to a corresponding one of said conductive bumps; a plurality of first metal elements each having a first arm portion located on said upper surface of said first semiconductor chip, a second arm portion located on said lower surface of said first semiconductor chip and connected electrically to a corresponding one of said conductive metal lines on said lower surface of said first semiconductor chip, and a connecting portion interconnecting said first and second arm portions; a second semiconductor chip having an upper surface, a lower surface opposed to said upper surface, a plurality of contacts formed on said lower surface of said second semiconductor chip and connected electrically to internal circuitry of said second semiconductor chip, and a plurality of conductive metal lines formed on said lower surface of said second semiconductor chip, each of said conductive metal lines extending from a corresponding edge of said second semiconductor chip to a corresponding one of said contacts; and a plurality of second metal elements each having a first arm portion located on said upper surface of said second semiconductor chip, a second arm portion located on said lower surface of said second semiconductor chip and connected electrically to a corresponding one of said conductive metal lines on said lower surface of said second semiconductor chip, and a connecting portion interconnecting said first and second arm portions, said second semiconductor chip mounted on said first semiconductor chip in such a manner that said second arm portion of each of said second metal elements is connected electrically to said first arm portion of a corresponding one of said first metal elements.

According to still another aspect of the present invention, a semiconductor chip package comprises: at least one semiconductor chip having a lower surface and a plurality of conductive bumps provided on said lower surface; and a casing having an accommodating recess filled with epoxy resin, said at least one semiconductor chip received in said accommodating recess in such a manner that said conductive bumps of said at least one semiconductor chip are exposed.

DETAILED DESCRIPTION OF THE PREFERRED EMBODIMENTS

Figure 1:
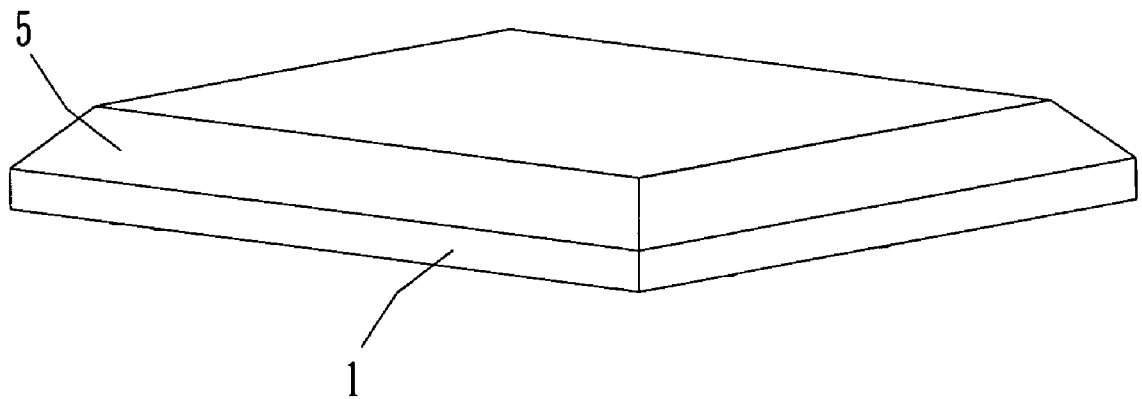
FIGS. 1 to 4 are schematic diagrams illustrating a semiconductor chip package according to a first embodiment of the present invention.
Figure 2:
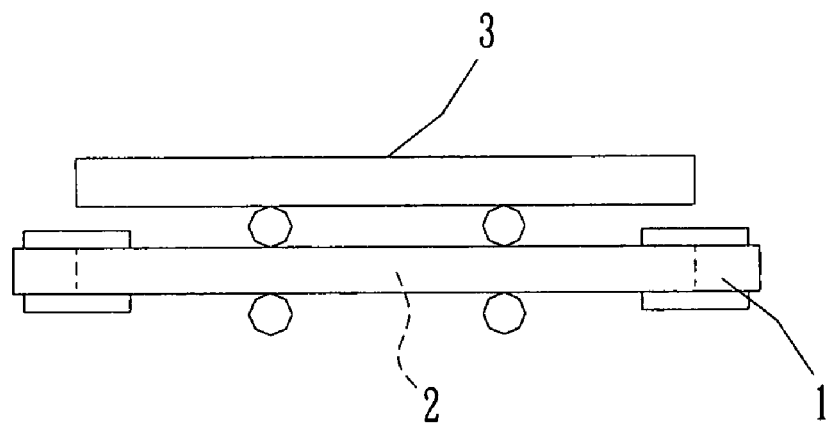
Figure 3:
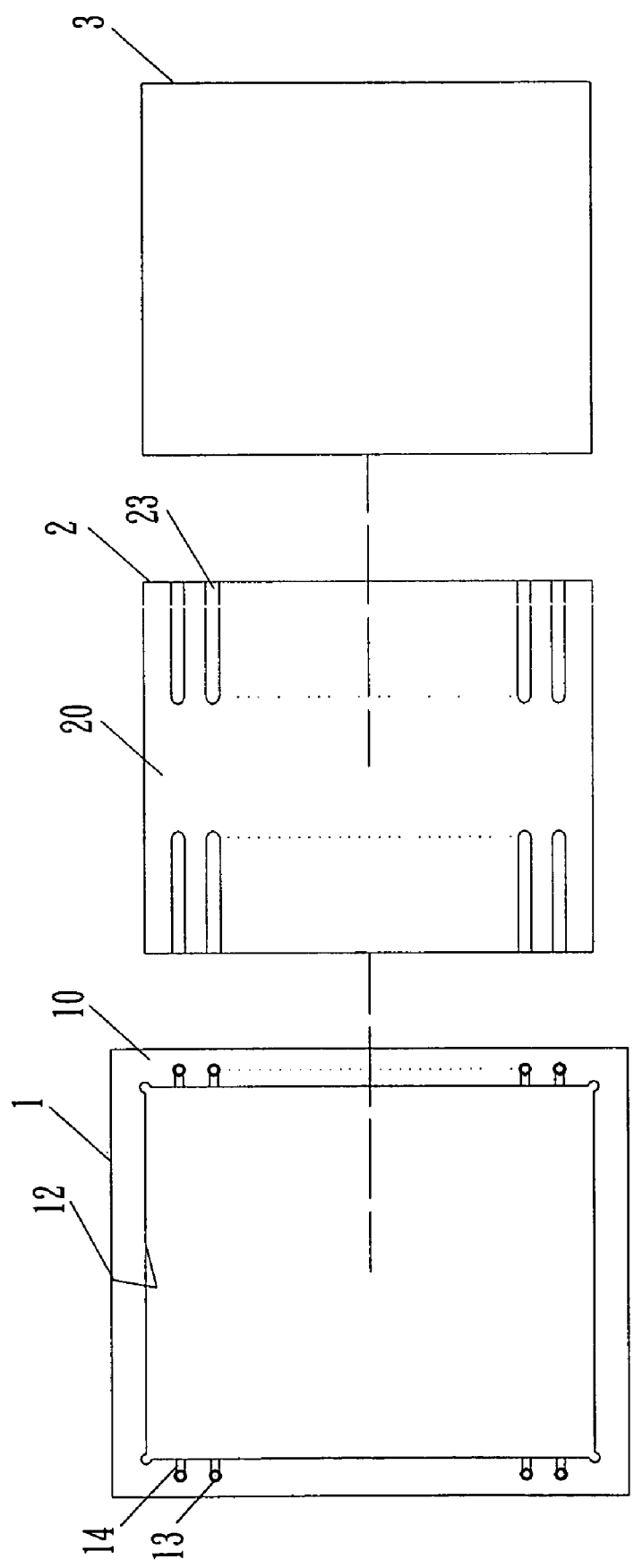
Figure 4:
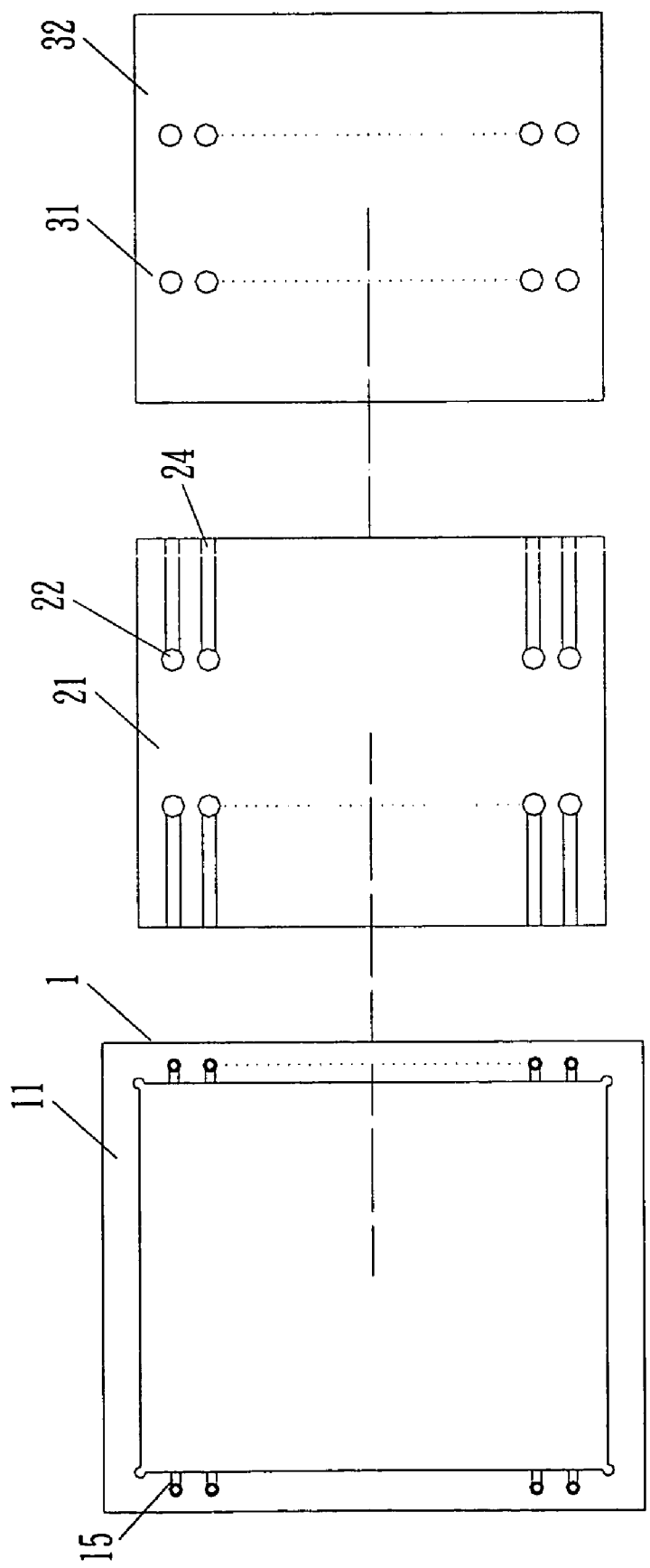
Figure 5:
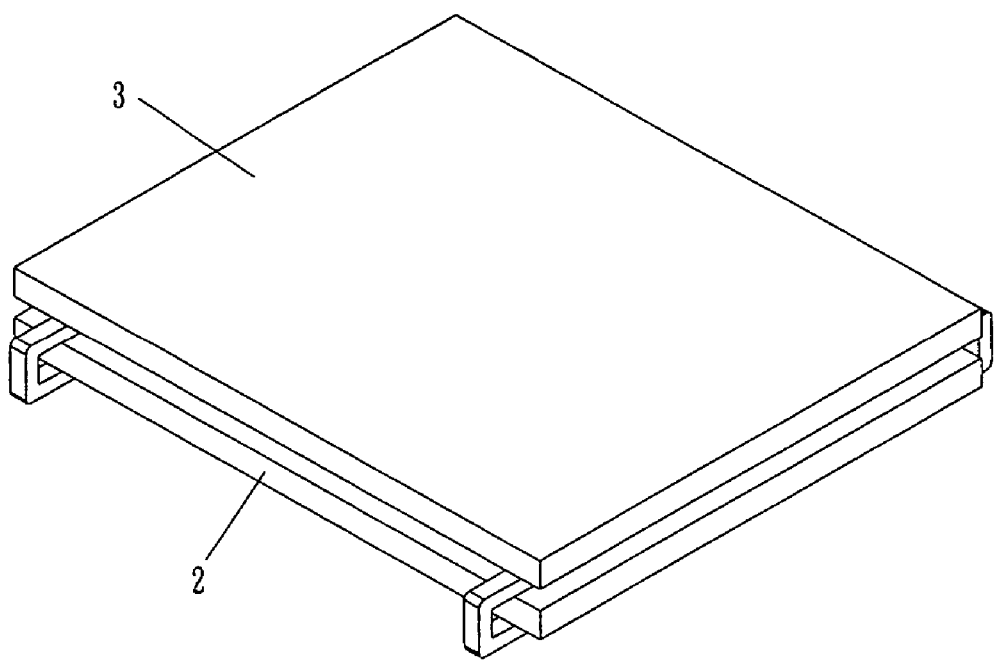
FIGS. 5 to 8 are schematic diagrams illustrating a semiconductor chip package according to a second embodiment of the present invention.
Figure 6:
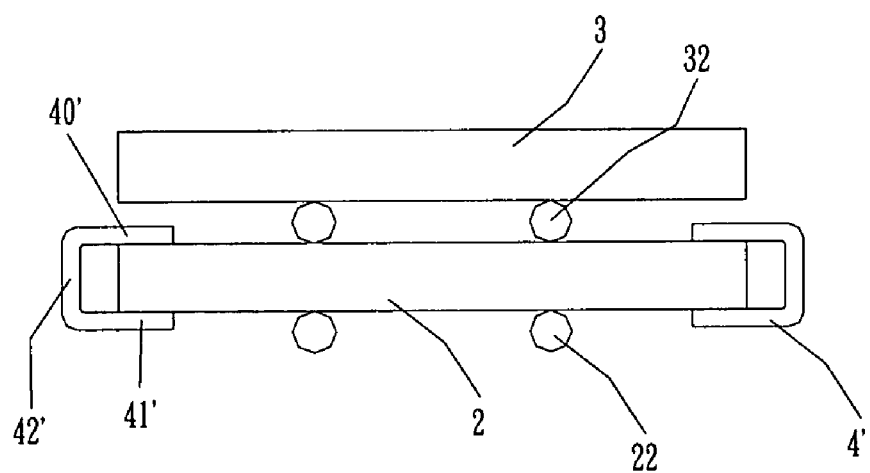

Preferred embodiments of the present invention will be described below with reference to the accompanying drawings.

It should be noted that the same numeral is used to indicate the same element throughout the whole specification. Furthermore, the elements are not drawn to scale so as to clearly show the features of the present invention.

Referring to FIGS. 1 to 4, a stacked semiconductor chip package according to a first embodiment of the present invention includes a mounting substrate 1, a first semiconductor chip 2, and a second semiconductor chip 3.

The mounting substrate 1 has an upper surface 10, a lower surface 11 opposed to the upper surface 10, a rectangular accommodating opening 12, and a plurality of plated through-holes 13 each communicating the upper and lower surfaces 10 and 11. On the upper surface 10 of the mounting substrate 1, a plurality of first conductive metal lines 14 are formed. Each of the first conductive metal lines 14 extends from a corresponding one of the plated through-holes 13 to one of the opening-confining walls that confine the opening 12.

On the lower surface 11 of the mounting substrate 1, a plurality of second conductive metal lines 15 are formed. Each of the second conductive metal lines 15 extends from a corresponding one of the plated through-hole 13 to one of the opening-confining walls.

The first semiconductor chip 2 has an upper surface 20, a lower surface 21 opposed to the upper surface 20, and a plurality of conductive bumps 22 provided on the lower surface 21 of the first semiconductor chip 2. On the upper surface 20 of the first semiconductor chip 2, a plurality of third conductive metal lines 23 are formed. Each of the third conductive metal lines 23 extends from a corresponding edge of the first semiconductor chip 2 to a position registered with the corresponding one of the conductive bumps 22.

On the lower surface 21 of the first semiconductor chip 2, a plurality of fourth conductive metal lines 24 is formed. Each of the fourth conductive metal lines 24 extends from a corresponding edge of the first semiconductor chip 2 to a corresponding one of the conductive bumps 22 so as to connect electrically with the corresponding one of the conductive bumps 22.

The first semiconductor chip 2 is received in the accommodating opening 12 of the mounting substrate 1 so that each of the third conductive metal lines 23 on the upper surface 20 of the first semiconductor chip 2 is linked with a corresponding one of the first conductive metal lines 14 on the upper surface 10 of the mounting substrate 1, and that each of the fourth conductive metal lines 24 on the lower surface 21 of the first semiconductor chip 2 is linked with a corresponding one of the second conductive metal lines 15 on the lower surface 11 of the mounting substrate 1.

To ensure a reliable electrical connection between the third and fourth conductive metal lines 23 and 24 respectively on the upper and lower surface 20 and 21 of the first semiconductor chip 2 and a corresponding one of the first and second conductive metal lines 14 and 15 respectively on the upper and lower surface 10 and 11 of the mounting substrate 1, each two linked metal lines 23,24,14 and 15 are connected with a conductive metal member 4. The conductive metal members 4 are formed of conductive metal material such as solder paste, silver paste, metallic paste, wires, etc.

The second semiconductor chip 3 has a lower surface 31 and a plurality of conductive bumps 32 provided on the lower surface 31, and is mounted on the upper surface 20 of the first semiconductor chip 2 such that the solder bumps 32 of the second semiconductor chip 3 are electrically connected to the corresponding third conductive metal lines 23 on the upper surface 20 of the first semiconductor chip 2. As such, internal circuitry of the second semiconductor chip 3 can be electrically connected to external circuit (not shown) via the conductive bumps 32, the third conductive metal lines 23, the plated through-holes 13, the fourth conductive metal lines 24, and the conductive bumps 22.

An insulating protective layer 5 (see FIG. 1) is formed on the upper surface 10 of the mounting substrate 1 surrounding the second semiconductor chip 3 such that relative movement and moisture introduction between the first and second semiconductor chips 2 and 3 can be prevented.

Figure 21:
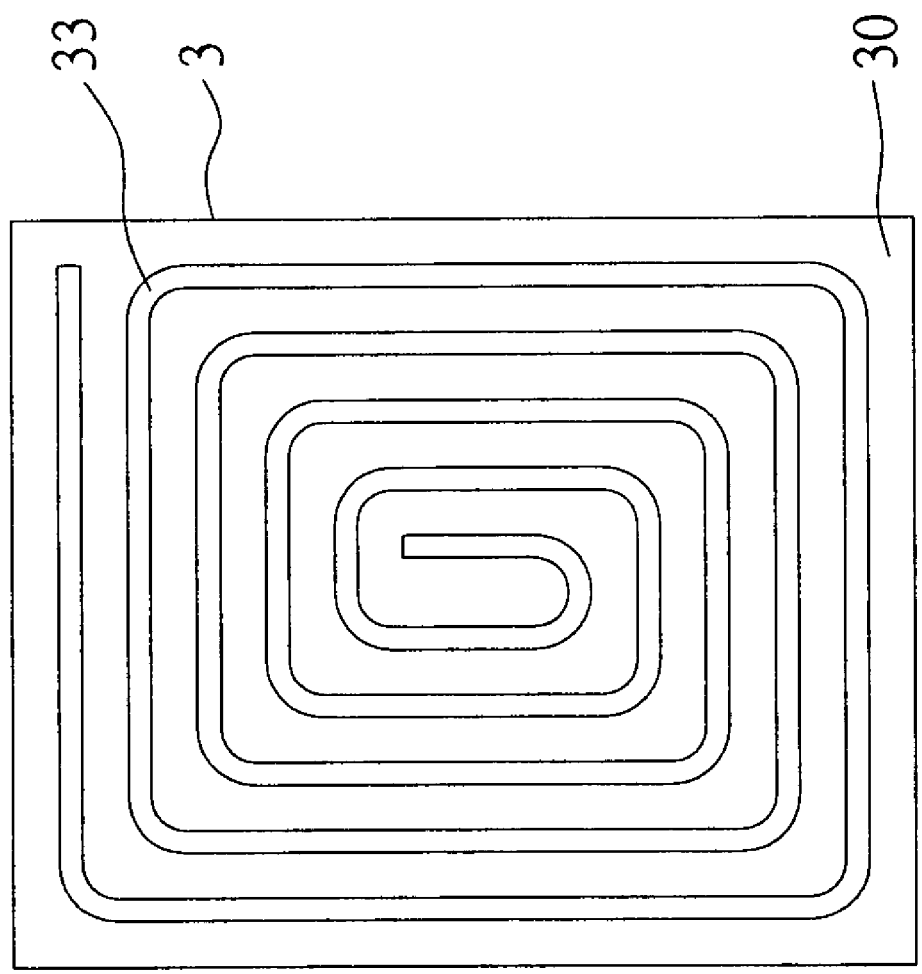
FIG. 21 is a schematic diagram illustrating an upper surface of the topmost semiconductor chip in a stacked semiconductor chip package according to the present invention.

It should be noted that conductive metal lines (not shown) similar to those provided on the upper surface 20 of the first semiconductor chip 2 may also be provided on the upper surface of the second semiconductor chip 3 for electrical connection with solder bumps (not shown) of a further semiconductor chip (not shown) stacked thereon. Alternatively, any desired electrical circuit traces 33 (see FIG. 21), such as antenna loop for receiving and emitting electrical waves, detector for biometrics, and so on, can be provided on the upper surface of the second semiconductor 3.

On the other hand, the first and second semiconductor chips 2 and 3 may have different dimension, functionality, etc.

FIGS. 5 to 8 are diagrams showing a stacked semiconductor chip package according to a second embodiment of the present invention.

Referring to FIGS. 5 to 8, the stacked semiconductor chip package according to the present embodiment includes a first semiconductor chip 2 and a second semiconductor chip 3.

The first semiconductor chip 2 has an upper surface 20, a lower surface 21 opposed to the upper surface 20, and a plurality of conductive bumps 22 provided on the lower surface 21 of the first semiconductor chip 2. On the upper surface 20 of the first semiconductor chip 2, a plurality of third conductive metal lines 23 are formed. Each of the third conductive metal lines 23 extends from a corresponding edge of the first semiconductor chip 2 to a position corresponding to the corresponding one of the conductive bumps 22.

On the lower surface 21 of the first semiconductor chip 2, a plurality of fourth conductive metal lines 24 is formed. Each of the fourth conductive metal lines 24 extends from a corresponding edge of the first semiconductor chip 2 to a corresponding one of the conductive bumps 22 so as to connect electrically with the corresponding one of the conductive bumps 22.

Each of the third conductive lines 23 is connected electrically to a corresponding one of the fourth conductive lines 24 via a metal element 4'. In the present embodiment, the metal element 4' is a generally C-shaped metal clip. Each of the metal elements 4' has a first arm portion 40' located on the upper surface 20 of the first semiconductor chip 2 and connected electrically to a corresponding one of the third metal lines 23, a second arm portion 41' located on the lower surface 21 of the first semiconductor chip 2 and connected electrically to a corresponding one of the fourth metal lines 24, and a connecting portion 42' interconnecting the first and second arm portions 40' and 41'.

The second semiconductor chip 3 has a lower surface 31 and a plurality of conductive bumps 32 provided on the lower surface 31, and is mounted on the upper surface 20 of the first semiconductor chip 2 such that the solder bumps 32 of the second semiconductor chip 3 is electrically connected to the corresponding third conductive metal lines 23 on the upper surface 20 of the first semiconductor chip 2. As such, internal circuitry of the second semiconductor chip 3 can be electrically connected to external circuit (not shown) via the conductive bumps 32, the third conductive metal lines 23, the metal elements 4', the fourth conductive metal lines 24, and the conductive bumps 22.

Figure 9:
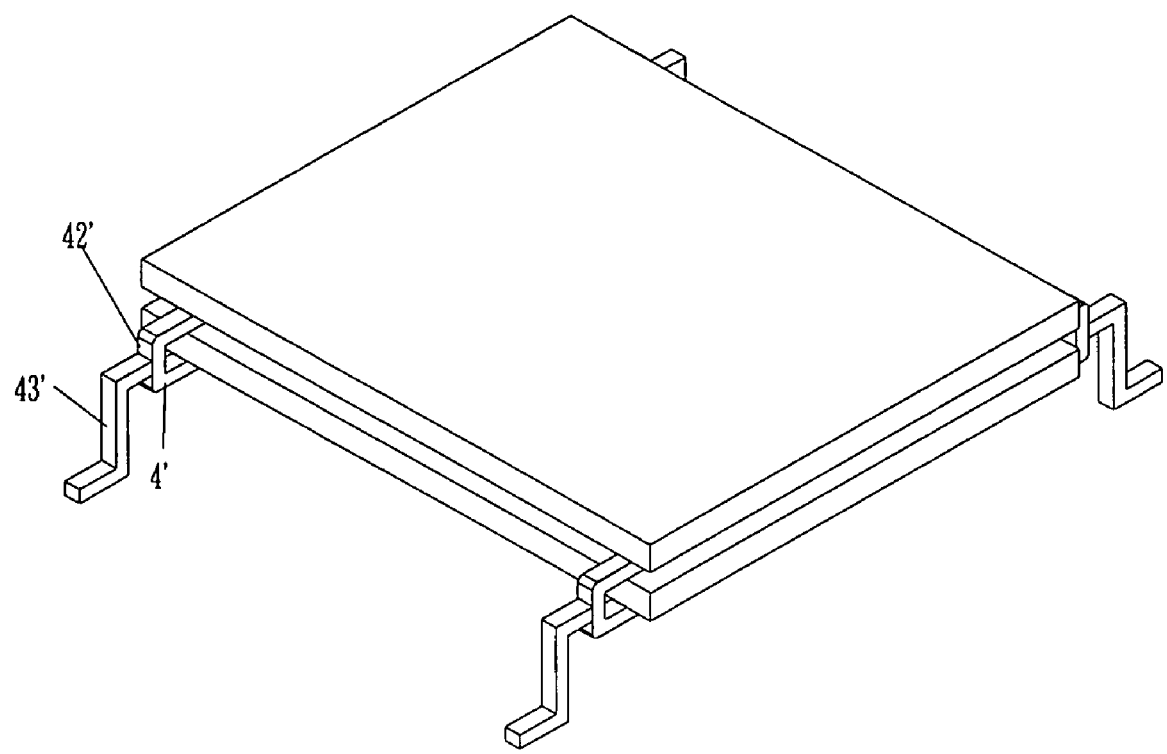
FIGS. 9 and 10 are schematic diagrams illustrating a semiconductor chip package according to a third embodiment of the present invention.
Figure 10:
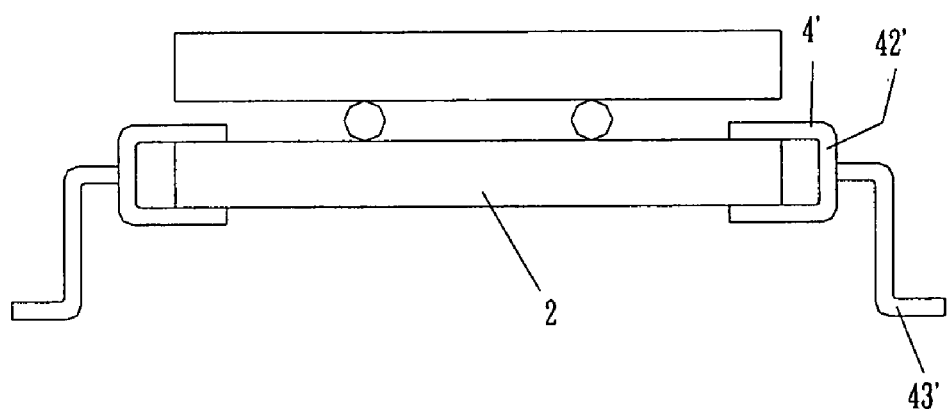
Figure 11:
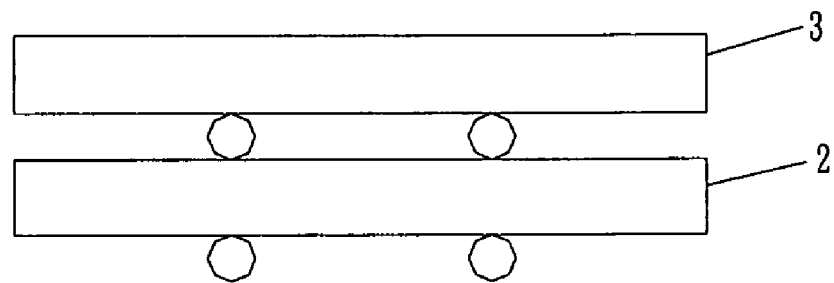
FIGS. 11 to 14 are schematic diagrams illustrating a semiconductor chip package according to a fourth embodiment of the present invention.
Figure 12:
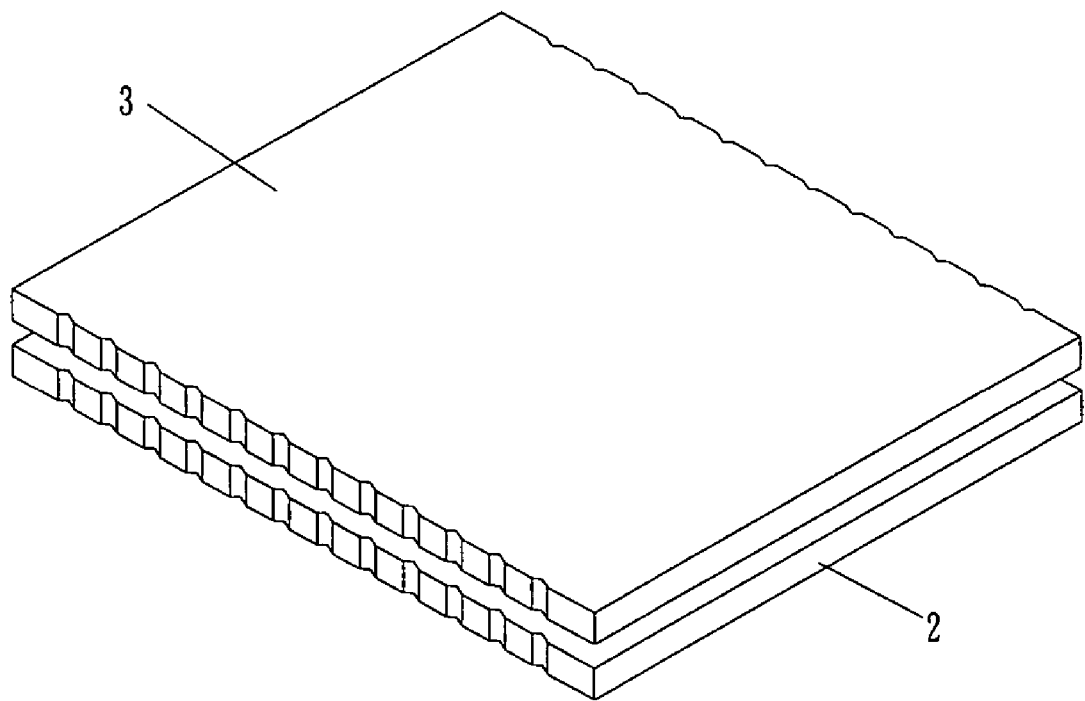
Figure 13:
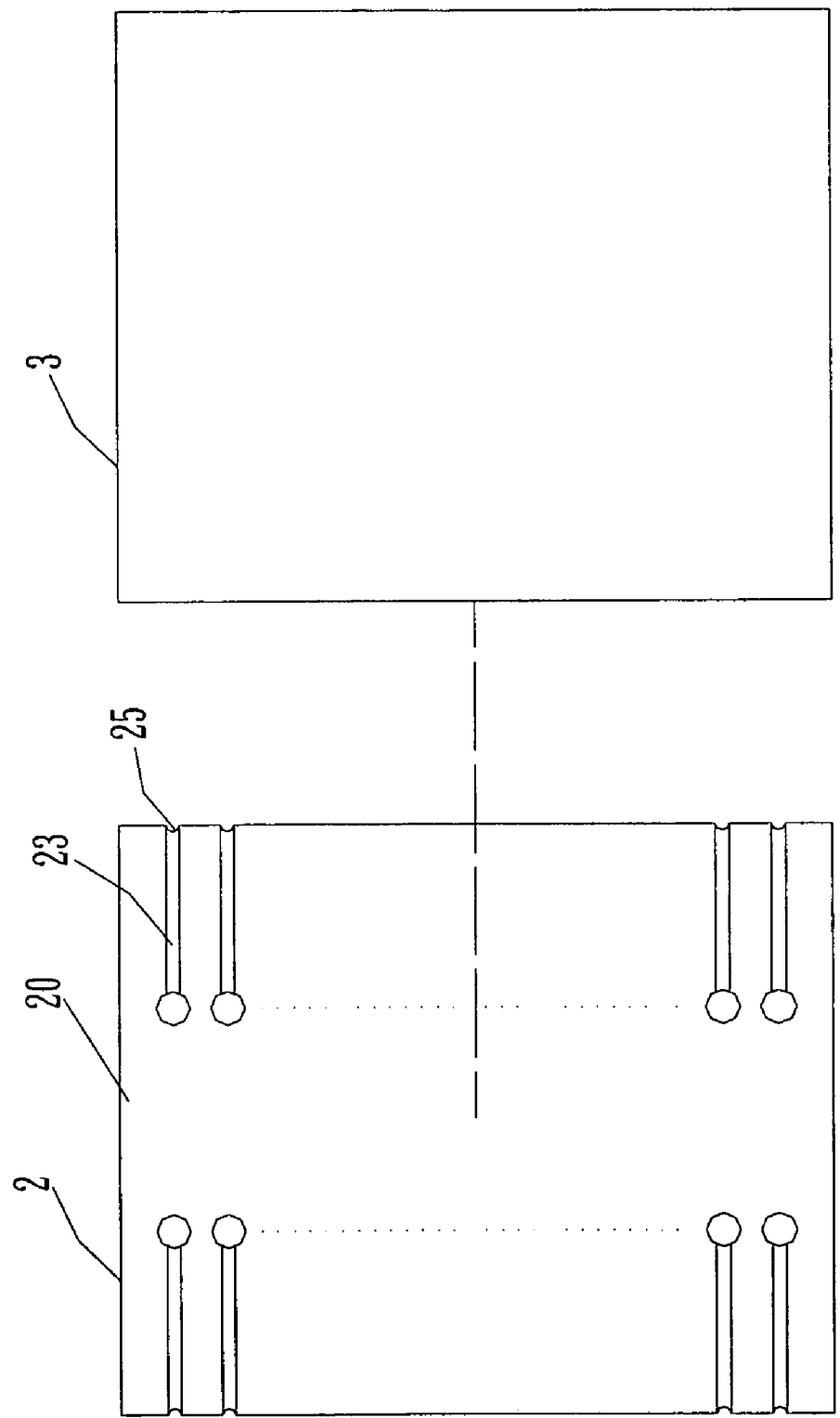
Figure 14:
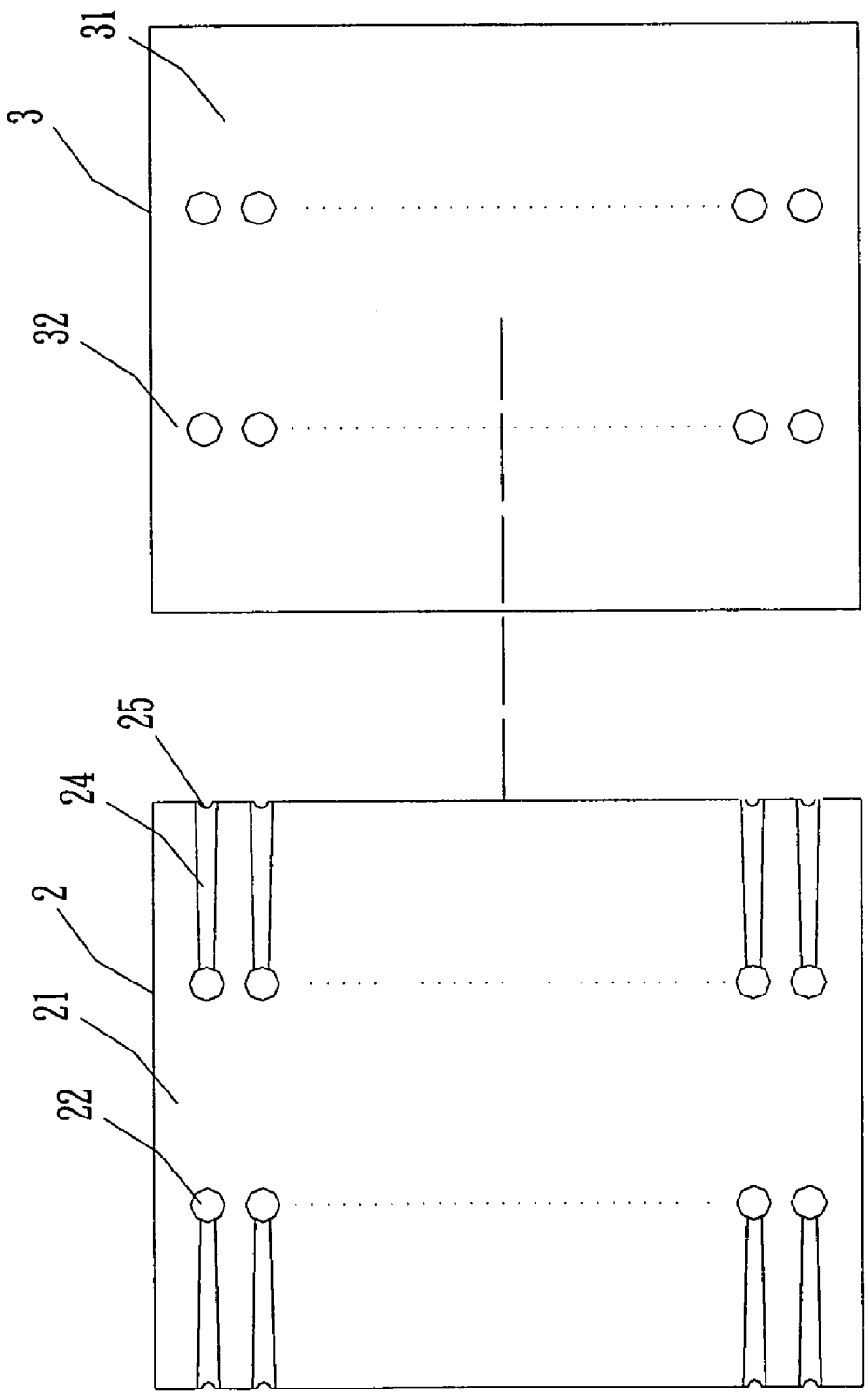

FIGS. 9 and 10 are diagrams showing a stacked semiconductor chip package according to a third embodiment of the present invention.

As shown in FIGS. 9 and 10, unlike to the second embodiment, each of the metal elements 4' further includes an external circuit connecting portion 43' which extends outwardly from the connecting portion 42' thereof and which is to be connected electrically to an external circuit (not shown) such that the conductive bumps 22 and the metal lines 24 on the lower surface of the first semiconductor chip 2 as described in the second embodiment can be omitted.

FIGS. 11 to 14 are diagrams showing a stacked semiconductor chip package according to a fourth embodiment of the present invention.

Referring to FIGS. 11 to 14, a stacked semiconductor chip package according to the present embodiment includes a first semiconductor chip 2 and a second semiconductor chip 3.

The first semiconductor chip 2 has an upper surface 20, a lower surface 21 opposed to the upper surface 20, a plurality of conductive bumps 22 provided on the lower surface 21 of the first semiconductor chip 2, and a plurality of semi-circular plated holes 25 located along the edges of the first semiconductor chip 2. The formation of the semi-circular plated holes 25 may be achieved by forming a plurality of through-holes along the cutting lines of a wafer via drilling, making the through-holes to be plated through-holes via plating, and cutting the wafer along the cutting lines. It should be noted that the semi-circular plated holes 25 could be formed via any other suitable method. For example, the through-holes can be filled with conductive paste instead of plating.

On the upper surface 20 of the first semiconductor chip 2, a plurality of third conductive metal lines 23 are formed. Each of the third conductive metal lines 23 extends from a position corresponding to a corresponding one of the conductive bumps 22 to a corresponding one of the plated holes 25.

On the lower surface 21 of the first semiconductor chip 2, a plurality of fourth conductive metal lines 24 is formed. Each of the fourth conductive metal lines 24 extends from a corresponding one of the conductive bumps 22 to a corresponding one of the plated holes 25 so as to connect electrically with the corresponding one of the conductive bumps 22.

The second semiconductor chip 3 has a lower surface 31 and a plurality of conductive bumps 32 provided on the lower surface 31, and is mounted on the upper surface 20 of the first semiconductor chip 2 such that the solder bumps 32 of the second semiconductor chip 3 is electrically connected to the corresponding third conductive metal lines 23 on the upper surface 20 of the first semiconductor chip 2. As such, internal circuitry of the second semiconductor chip 3 can be electrically connected to external circuit (not shown) via the conductive bumps 32, the third conductive metal lines 23, the fourth conductive metal lines 24, and the conductive bumps 22.

Figure 15:
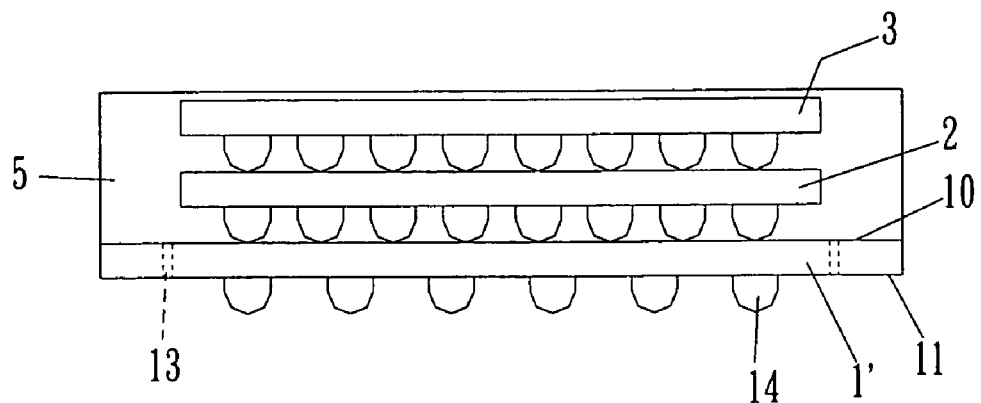
FIG. 15 is a schematic diagram illustrating a semiconductor chip package according to a fifth embodiment of the present invention.

FIG. 15 is a schematic sectional diagram showing a stacked semiconductor chip package according to a fifth embodiment of the present invention.

As shown in FIG. 15, the stacked semiconductor chip package of the present embodiment includes a carrying substrate 1', a first semiconductor chip 2, a second semiconductor chip 3, and a protective layer 5.

The carrying substrate 1' has an upper surface 10, a lower surface 11, a plurality of plated through-holes 13 communicating the upper and lower surfaces 10 and 11, and a plurality of conductive bumps 14 provided on the lower surface 11 of the carrying substrate 1'. A plurality of first conductive metal lines (not shown) similar to those in the first embodiment is formed on the upper surface 10 of the carrying substrate 1'. Each of the first conductive metal lines extends from a corresponding one of the plated through-holes 13 to a predetermined position.

A plurality of second conductive metal lines (not shown) similar to those in the first embodiment is formed on the lower surface 11 of the carrying substrate 1'. Each of the second conductive metal lines extends from a corresponding one of the plated through-holes 13 to a corresponding one of the conductive bumps 14 so as to connect electrically with the corresponding one of the conductive bumps 14. The first conductive metal lines are connected electrically to the second conductive metal lines via corresponding plated through-holes 13.

The first semiconductor chip 2 is similar to that in the fourth embodiment and thus detail description thereof is omitted. The first semiconductor chip 2 is disposed on the upper surface 10 of the carrying substrate 1' such that the conductive bumps 22 of the first semiconductor chip 2 is connected electrically with the conductive metal lines on the upper surface 10 of the carrying substrate 1'.

The second semiconductor chip 3 is similar to that in the fourth embodiment and is disposed on the first semiconductor chip 2 in a similar manner as in the fourth embodiment.

The protective layer 5 is formed on the upper surface 10 of the substrate 1' so as to cover the semiconductor chips 2 and 3.

Figure 16:
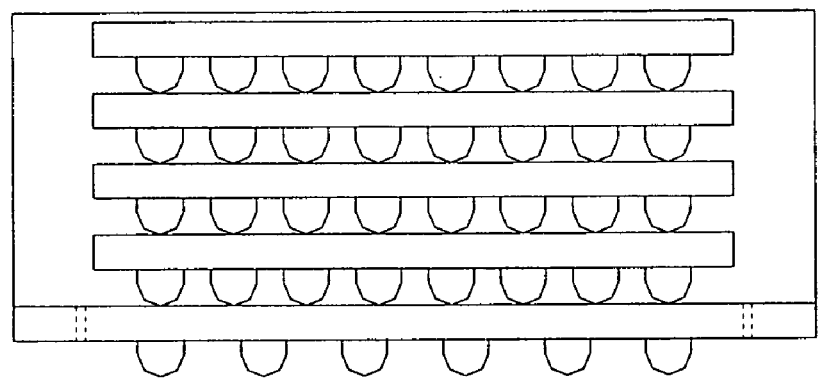
FIG. 16 is a schematic diagram illustrating a semiconductor chip package according to a sixth embodiment of the present invention.

FIG. 16 is a schematic sectional diagram showing a stacked semiconductor chip package according to a sixth embodiment of the present invention. Unlike to the fifth embodiment, the package of the present embodiment includes four semiconductor chips stacked on one another.

Figure 17:
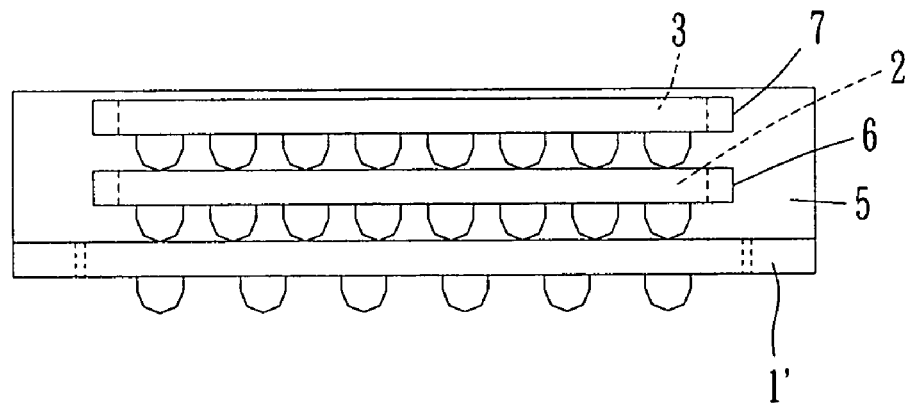
FIG. 17 is a schematic diagram illustrating a semiconductor chip package according to a seventh embodiment of the present invention.

FIG. 17 is a schematic sectional diagram showing a stacked semiconductor chip package according to a seventh embodiment of the present invention.

As shown in FIG. 17, the stacked semiconductor chip package of the present embodiment includes a carrying substrate 1', a first mounting substrate 6, a second mounting substrate 7, a first semiconductor chip 2, a second semiconductor chip 3, and a protective layer 5.

The carrying substrate 1' is similar to that described in the fifth embodiment and thus detail description thereof is omitted.

The first mounting substrate 6 is similar to that described in the first embodiment and thus detail description thereof is omitted.

The first semiconductor chip 2 is similar to that in the fourth embodiment and is disposed on the first mounting substrate 6 in a same manner as that in the first embodiment, thus, detail description thereof is omitted.

The second mounting substrate 7 is as same as the first mounting substrate 6 and thus detail description thereof is omitted.

The second semiconductor chip 3 is similar to that in the first embodiment and is disposed on the second mounting substrate 7 in a same manner as that in the first embodiment.

The protective layer 5 is formed on the upper surface 10 of the carrying substrate 1' so as to cover the semiconductor chips 2 and 3.

Figure 18:
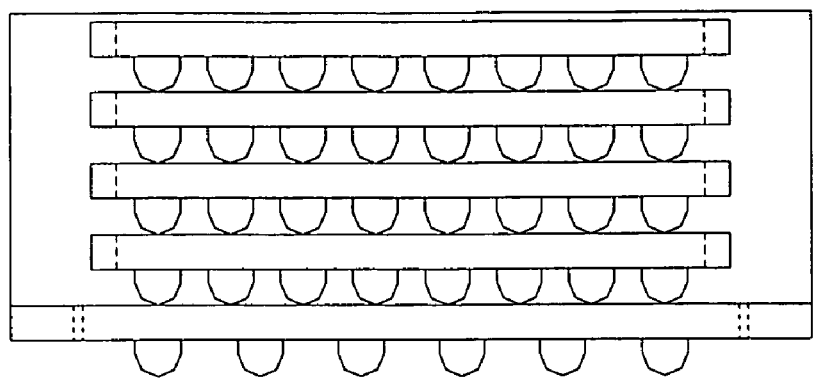
FIG. 18 is a schematic diagram illustrating a semiconductor chip package according to a eighth embodiment of the present invention.

FIG. 18 is a schematic sectional diagram showing a stacked semiconductor chip package according to an eighth embodiment of the present invention. Unlike to the seventh embodiment, the package of the present embodiment includes four semiconductor chips stacked on one another.

Figure 19:
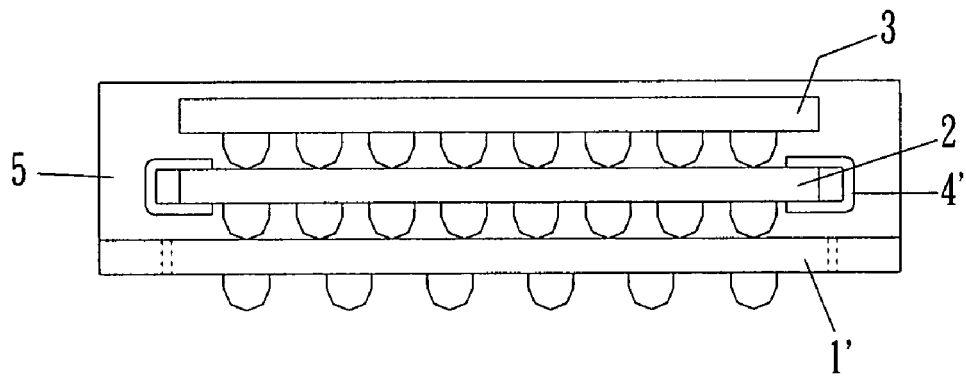
FIG. 19 is a schematic diagram illustrating a semiconductor chip package according to a ninth embodiment of the present invention.

FIG. 19 is a schematic sectional diagram showing a stacked semiconductor chip package according to a ninth embodiment of the present invention.

As shown in FIG. 19, the stacked semiconductor chip package of the present embodiment includes a carrying substrate 1', a first semiconductor chip 2, a second semiconductor chip 3, and a protective layer 5.

The carrying substrate 1' is as same as that described in the fifth embodiment and thus detail description thereof is omitted.

The first semiconductor chip 2 and the second semiconductor chip 3 are as same as those described in the second embodiment and are stacked in a manner similar to that in the second embodiment, therefore, detail description thereof is omitted herein.

The first semiconductor chip 2 is disposed on the upper surface 10 of the carrying substrate 1' in a manner similar to that in the fifth embodiment, therefore, detail description thereof is omitted herein.

The protective layer 5 is formed on the upper surface 10 of the substrate 1' so as to cover the semiconductor chips 2 and 3.

Figure 20:
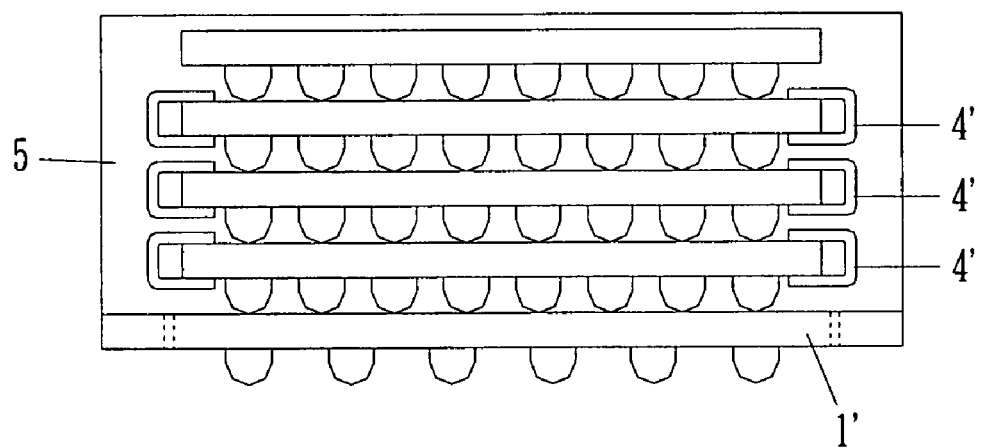
FIG. 20 is a schematic diagram illustrating a semiconductor chip package according to a tenth embodiment of the present invention.

FIG. 20 is a schematic sectional diagram showing a stacked semiconductor chip package according to a tenth embodiment of the present invention. Unlike to the ninth embodiment, the package of the present embodiment includes four semiconductor chips stacked on one another.

Figure 22:
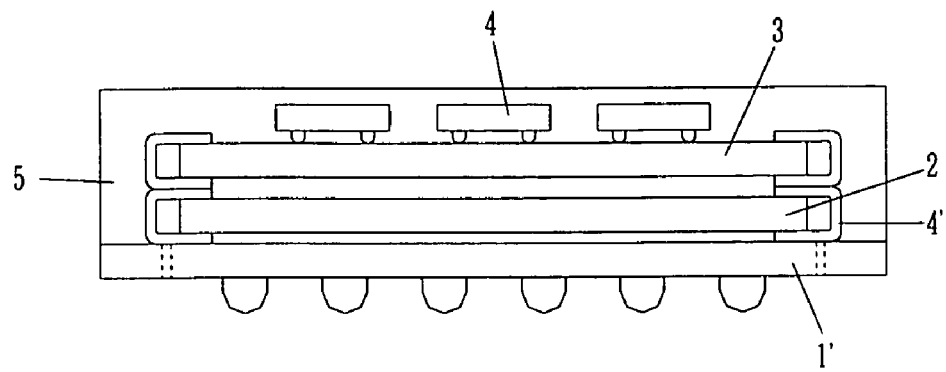
FIG. 22 is a schematic diagram illustrating a semiconductor chip package according to an eleventh embodiment of the present invention.

FIG. 22 is a schematic sectional diagram showing a stacked semiconductor chip package according to an eleventh embodiment of the present invention.

As shown in FIG. 22, the stacked semiconductor chip package of the present embodiment includes a carrying substrate 1', a first semiconductor chip 2, a second semiconductor chip 3, a plurality of third semiconductor chips 6, and a protective layer 5.

The carrying substrate 1' is as same as that described in the fifth embodiment and thus detail description thereof is omitted.

The first semiconductor chip 2 has an upper surface 20 and a lower surface 21 opposed to the upper surface 20. On the upper surface 20 of the first semiconductor chip 2, a plurality of third conductive metal lines 23 are formed in a manner similar to those in the second embodiment (see FIGS. 7 and 8).

Figure 7:
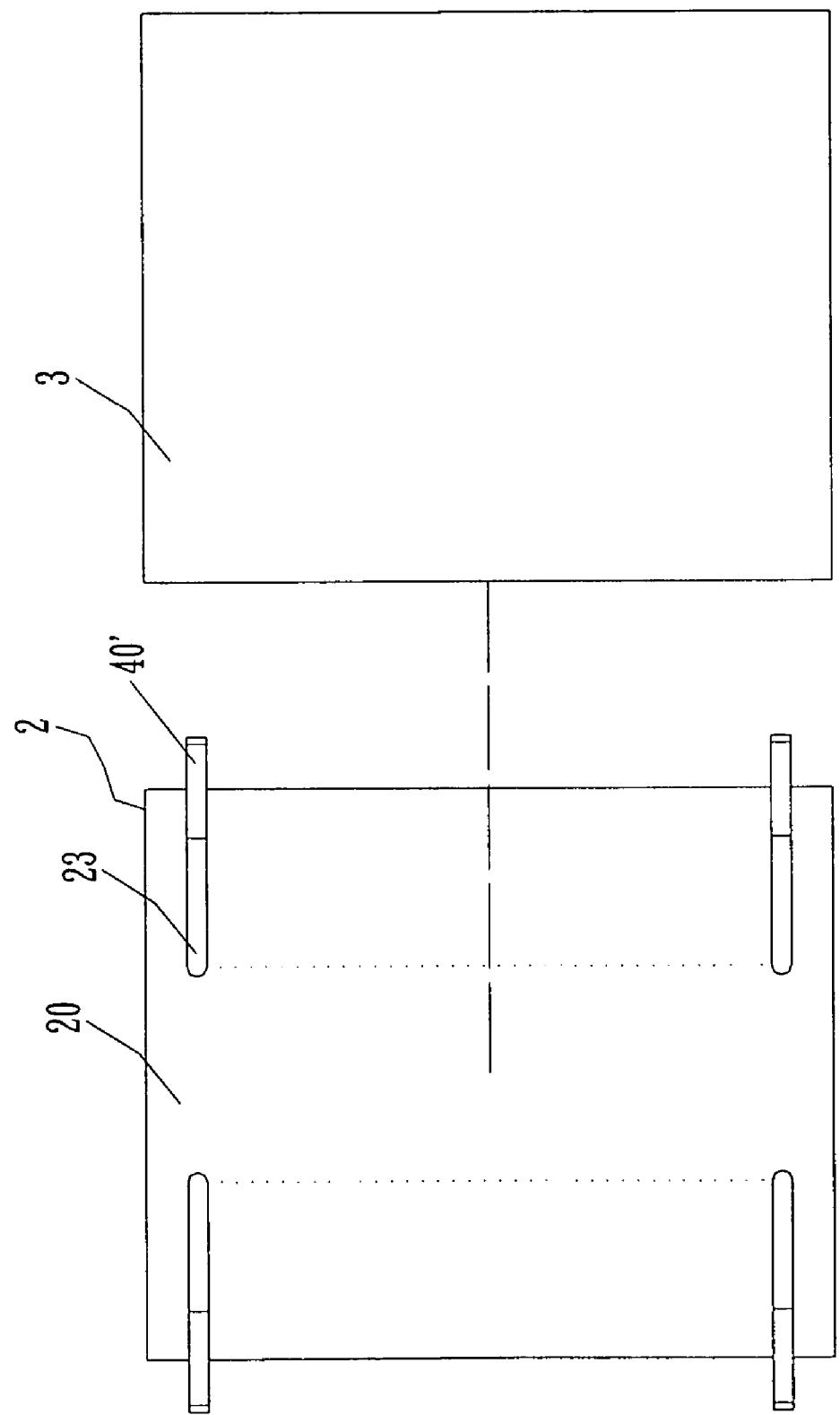
Figure 8:
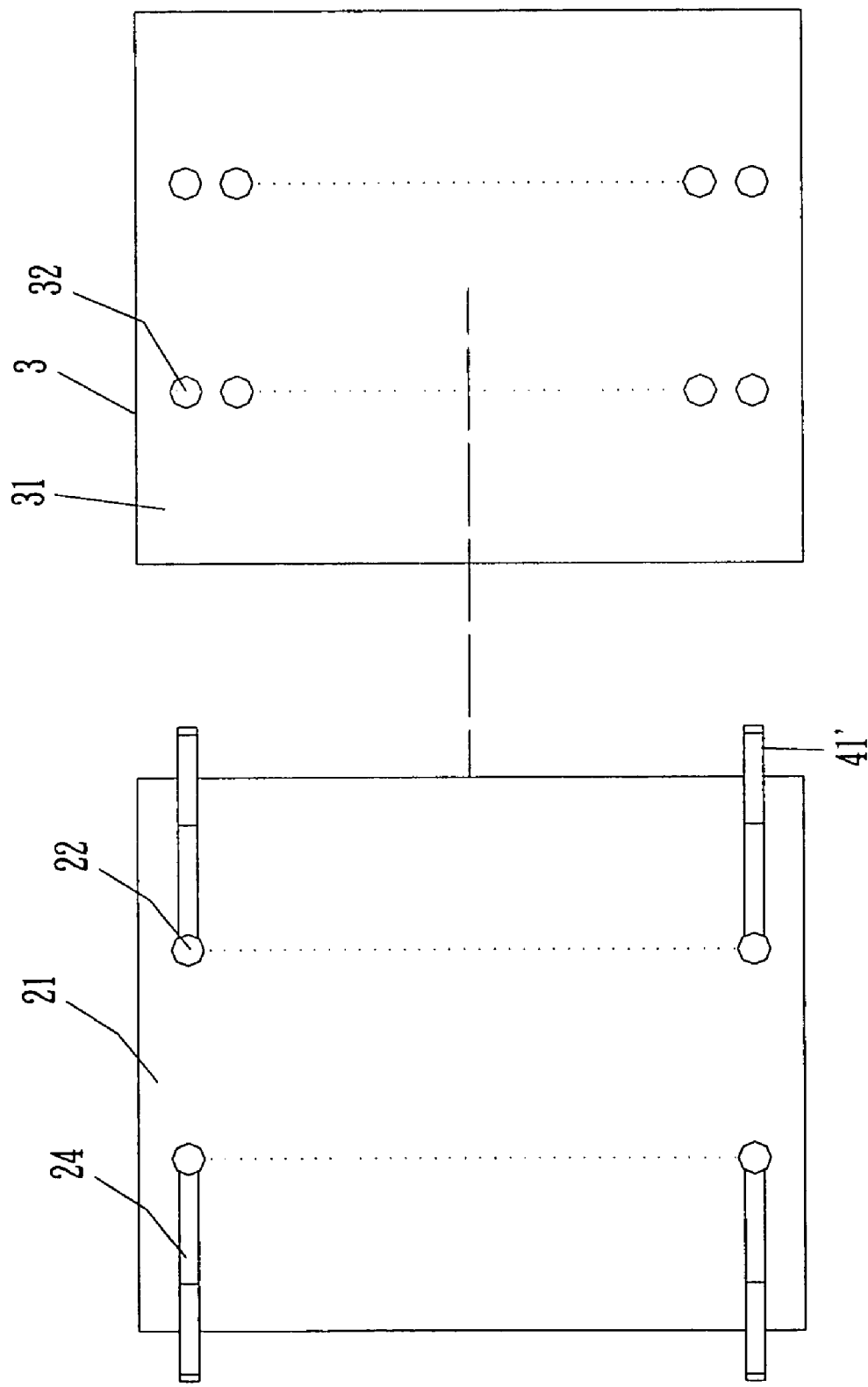

On the lower surface 21 of the first semiconductor chip 2, a plurality of fourth conductive metal lines 24 is formed in a manner similar to those in the second embodiment (see FIGS. 7 and 8).

Each of the third conductive lines 23 is connected electrically to a corresponding one of the fourth conductive lines 24 via a metal element 4' similar to that in the second embodiment.

The first semiconductor chip 2 is disposed on the upper surface 10 of the carrying substrate 1' in such a manner that the second arm portions 41' of the metal elements 4' are connected electrically to the corresponding first conductive lines on the upper surface of the carrying substrate 1'.

The second semiconductor chip 3 has an upper surface 30 and a lower surface 31 opposed to the upper surface 30. On the upper surface 30 of the second semiconductor chip 3, a plurality of fifth conductive metal lines are formed in a manner similar to those on the upper surface of the first semiconductor chip 2.

A plurality of metal elements 4' similar to those on the first semiconductor chip 2 is provided on the second semiconductor chip 3 in such a manner that the first arm portions of the metal elements 4' are connected to the corresponding fifth conductive lines on the upper surface of the second semiconductor chip 3.

The second semiconductor chip 3 is disposed on the upper surface 20 of the first semiconductor chip 2 in such a manner that the metal elements 4' on the second semiconductor chip 3 are connected electrically to the corresponding metal elements 4' on the first semiconductor chip 2.

The third semiconductor chips 6 may have different functionality and are mounted on the upper surface of the second semiconductor chip 3 via conductive bumps provided on the lower surfaces thereof in such a manner that the conductive bumps of the third semiconductor chips 6 are connected electrically to the corresponding fifth conductive lines on the upper surface of the second semiconductor chip 3.

The protective layer 5 is formed on the upper surface 10 of the carrying substrate 1' so as to cover the third semiconductor chips 6.

Figure 23:
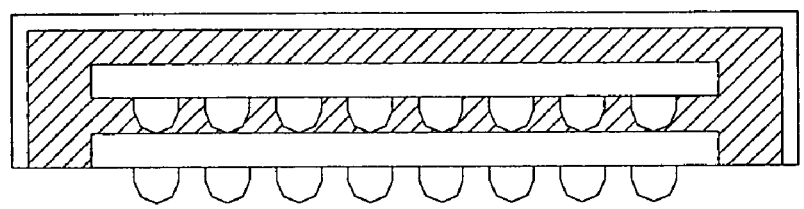
FIG. 23 is a schematic diagram illustrating a semiconductor chip package according to a twelfth embodiment of the present invention.

FIG. 23 is a schematic sectional diagram showing a stacked semiconductor chip package according to a twelfth embodiment of the present invention.

As shown in FIG. 23, the stacked semiconductor chip package of the present embodiment includes a first semiconductor chip 2, a second semiconductor chip 3, and a casing 7.

The first and second semiconductor chips 2 and 3 are as same as those described in the fourth embodiment and are stacked on one another in a manner similar to that in the fourth embodiment, therefore, detailed descriptions thereof are omitted herein.

The casing 7 has an accommodating recess 70 which receives the semiconductor chips 2 and 3 in an upside down manner and which is filled with epoxy resin such that relative movement between the casing 7 and the chips 2,3 is prevented and that the conductive bumps of the first semiconductor chip 2 are exposed.

Figure 24:
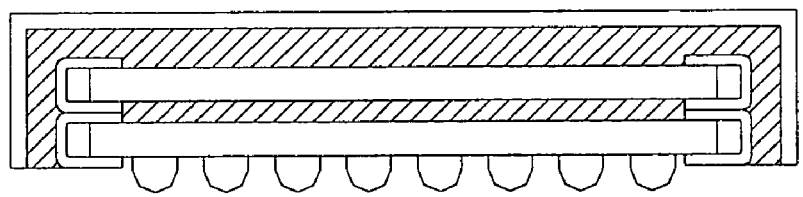
FIG. 24 is a schematic diagram illustrating a semiconductor chip package according to a thirteenth embodiment of the present invention.

FIG. 24 is a schematic sectional diagram showing a stacked semiconductor chip package according to a thirteenth embodiment of the present invention.

As shown in FIG. 24, the stacked semiconductor chip package of the present embodiment includes a first semiconductor chip 2, a second semiconductor chip 3, and a casing 7.

Unlike to the twelfth embodiment, the first and second semiconductor chips 2 and 3 are as same as those described in the eleventh embodiment and are stacked on one another in a manner similar to that in the eleventh embodiment, therefore, detailed descriptions thereof are omitted herein.

Figure 25:
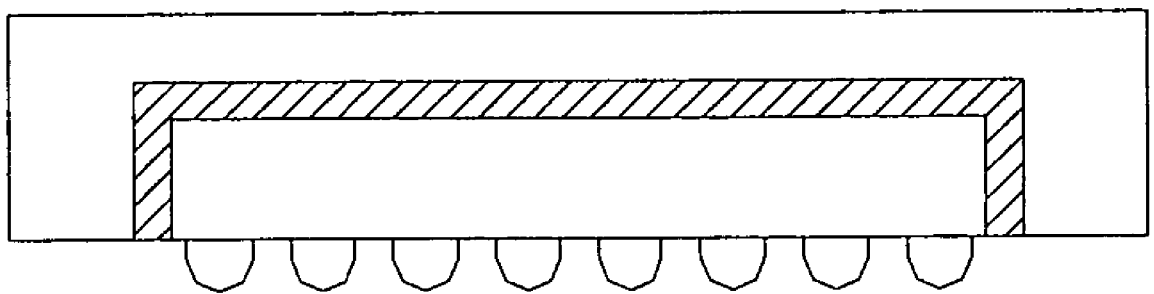
FIG. 25 is a schematic diagram illustrating a semiconductor chip package according to a fourteenth embodiment of the present invention.

FIG. 25 is a schematic sectional diagram showing a stacked semiconductor chip package according to a fourteenth embodiment of the present invention.

Unlike to the twelfth embodiment, the present embodiment only includes one semiconductor chip.

What is claimed is:

1. A stacked semiconductor chip package, comprising:
   a mounting substrate having an upper surface and a lower surface opposed to said upper surface,
   a rectangular accommodating opening formed at a central portion of said mounting substrate,
   a plurality of plated through-holes each communicating said upper and lower surfaces,
   a plurality of first conductive metal lines formed on said upper surface of said mounting substrate, and
   a plurality of second conductive metal lines formed on said lower surface of said mounting substrate, each of said first conductive metal lines extending from a corresponding one of said plated through-holes to one of opening-confining walls that cooperatively confine said opening, each of said second conductive metal lines extending from a corresponding one of said plated through-hole to one of said opening-confining walls; a first semiconductor chip having an upper surface and a lower surface opposed to said upper surface, a plurality of conductive bumps provided on said lower surface of said first semiconductor chip, a plurality of third conductive metal lines formed on said upper surface of said first semiconductor chip, a plurality of fourth conductive metal lines formed on said lower surface of said first semiconductor chip, each of said third conductive metal lines extending from a corresponding edge of said first semiconductor chip to a predetermined position, each of said fourth conductive metal lines extending from a corresponding edge of said first semiconductor chip to a corresponding one of said conductive bumps so as to connect electrically with said corresponding one of said conductive bumps, said first semiconductor chip received in said accommodating opening of said mounting substrate so that each of said third conductive metal lines is linked electrically with a corresponding one of said first conductive metal lines, and that each of said fourth conductive metal lines is linked electrically with a corresponding one of said second conductive metal lines; and a second semiconductor chip having a lower surface and a plurality of conductive bumps provided on said lower surface, and mounted on said upper surface of the first semiconductor chip in such a manner that said conductive bumps of said second semiconductor chip are electrically connected to said corresponding third conductive metal lines.

2. The stacked semiconductor chip package as claimed in claim 1, further comprising an insulating protective layer formed on said upper surface of the mounting substrate surrounding said second semiconductor chip.

3. The stacked semiconductor chip package as claimed in claim 2, further comprising a plurality of conductive metal members each connected electrically one of said third conductive metal lines with a corresponding one of said fourth conductive metal lines.

4. The stacked semiconductor chip package as claimed in claim 2, wherein said second semiconductor chip further has an upper surface and a plurality of conductive metal lines formed on said upper surface thereof.

5. The stacked semiconductor chip package as claimed in claim 2, wherein said first and second semiconductor chips have different functionality.

6. The stacked semiconductor chip package as claimed in claim 1, further comprising a plurality of conductive metal members each connected electrically one of said third conductive metal lines with a corresponding one of said fourth conductive metal lines.

7. The stacked semiconductor chip package as claimed in claim 1, wherein said second semiconductor chip further has an upper surface and a plurality of conductive metal lines formed on said upper surface thereof.

8. The stacked semiconductor chip package as claimed in claim 1, wherein said first and second semiconductor chips have different functionality.

* * * * *